(12) United States Patent
Huang et al.

(10) Patent No.: US 7,052,932 B2
(45) Date of Patent: May 30, 2006

(54) OXYGEN DOPED SIC FOR CU BARRIER AND ETCH STOP LAYER IN DUAL DAMASCENE FABRICATION

(75) Inventors: Liu Huang, Singapore (SG); John Sudijono, Singapore (SG); Koh Yee Wee, Johor (MY)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 26 days.

(21) Appl. No.: 10/785,520

(22) Filed: Feb. 24, 2004

(65) Prior Publication Data

US 2005/0184295 A1    Aug. 25, 2005

(51) Int. Cl.
*H01L 21/00*    (2006.01)
(52) U.S. Cl. .................. 438/105; 438/627; 438/643; 438/780; 438/789; 438/931; 257/77
(58) Field of Classification Search .............. None
See application file for complete search history.

(56) References Cited

U.S. PATENT DOCUMENTS

| | | | | |
|---|---|---|---|---|
| 6,410,462 B1 | 6/2002 | Yang et al. | ............... | 438/788 |
| 6,417,090 B1 | 7/2002 | Wang et al. | ............... | 438/622 |
| 6,436,808 B1 | 8/2002 | Ngo et al. | .................. | 438/623 |
| 6,436,824 B1 | 8/2002 | Chooi et al. | ............... | 438/687 |
| 6,455,417 B1 | 9/2002 | Bao et al. | ................... | 438/637 |
| 6,472,333 B1 | 10/2002 | Xia et al. | .................. | 438/758 |
| 6,486,082 B1 * | 11/2002 | Cho et al. | .................. | 438/789 |
| 6,541,397 B1 | 4/2003 | Bencher | .................... | 438/780 |
| 6,670,715 B1 * | 12/2003 | Yang et al. | ................ | 257/760 |
| 6,873,057 B1 * | 3/2005 | Chen et al. | ................ | 257/777 |
| 6,879,046 B1 * | 4/2005 | Gibson et al. | ............. | 257/760 |
| 2005/0153537 A1 * | 7/2005 | Cheng et al. | .............. | 438/627 |

* cited by examiner

*Primary Examiner*—Andy Huynh
(74) *Attorney, Agent, or Firm*—George D. Saile; Rosemary L. S. Pike; Stephen B. Ackerman (57) ABSTRACT

A method of forming a dual damascene structure with improved performance is described. A first etch stop layer comprised of oxygen doped SiC is deposited on a SiC barrier layer to form a composite barrier/etch stop layer on a substrate. The remainder of the damascene stack is formed by sequentially depositing a first dielectric layer, a second oxygen doped SiC etch stop layer, and a second dielectric layer. A via and overlying trench are formed and filled with a diffusion barrier layer and a metal layer. The oxygen doped SiC layers have a lower dielectric constant than SiC or SiGN and a higher breakdown field than SiC. The etch selectivity of a $C_4F_8$/Ar etch for a SiCOH layer relative to the oxygen doped SiC layer is at least 6:1 because of a lower oxygen content in the oxygen doped SiC layer.

24 Claims, 4 Drawing Sheets

OXYGEN DOPED SiC FOR Cu BARRIER AND ETCH STOP LAYER IN DUAL DAMASCENE FABRICATION

FIELD OF THE INVENTION

The invention relates to the field of fabricating integrated circuits and other electronic devices and in particular to a dual damascene structure with high performance and improved reliability and a method for forming the same.

BACKGROUND OF THE INVENTION

The manufacture of an integrated circuit in a semiconductor device involves the formation of a metal layer that typically contains a wiring pattern which is overlaid on another conductive pattern. This process is repeated several times to produce a stack of metal layers. Metal interconnects which form horizontal and vertical electrical pathways in the device are separated by insulating or dielectric materials to prevent crosstalk between the metal wiring that can degrade device performance by slowing circuit speed. A popular method of forming an interconnect structure is a dual damascene process in which vias and trenches are filled with metal in the same step. A single damascene process is also commonly employed to form a metal pattern in one or more dielectric layers. The most frequently used dual damascene approach is a via first process in which a via is formed in a stack of dielectric layers and then a trench is formed above the via. Recent improvements in dual damascene processing include lowering the resistivity of the metal interconnect by switching from aluminum to copper and reducing the dielectric constant (k) of insulating materials to avoid capacitance coupling between the metal interconnects.

Current manufacturing practices involve forming vias and trenches that have sub-micron dimensions which can be less than 0.25 microns in width. One of the more promising low k dielectric materials is organosilicate glass (OSG) also known as SiCOH which is a silicon oxide that is doped with carbon and hydrogen atoms. Silicon oxide which has been traditionally used as a dielectric material has a dielectric constant of about 4. SiCOH has a k value between about 2 and 3 and thereby provides a much needed reduction in capacitance coupling between wiring. SiCOH is available as Black Diamond™ from Applied Materials, CORAL™ from Novellus, or can be obtained by different trade names from other manufacturers. The composition and properties of SiCOH may vary depending on the deposition conditions and source gases.

One concern with using SiCOH in a damascene structure is that the material as deposited is porous. A porous structure will allow moisture uptake which increases the dielectric constant and defeats the purpose of depositing a low k dielectric material. An organosilicate glass layer is employed as a thick dielectric layer in U.S. Pat. No. 6,472,333. A SiC cap layer is formed on the organosilicate glass (SiCOH) layer to provide increased hardness for a subsequent chemical mechanical polish (CMP) step and then the SiCOH layer is annealed for improved mechanical properties and a lower k value. An amorphous carbon cap layer on a low k dielectric layer is described in U.S. Pat. No. 6,541,397 and serves as an etch mask and as a CMP stop layer.

In some cases, densification after annealing is desirable. A well known method of densifying a porous SiCOH layer is to perform a plasma treatment such as the $N_2/NH_3$ plasma process described in U.S. Pat. No. 6,436,808. Besides stabilizing the dielectric constant, the densification also improves SiCOH resistance to etchants such as $O_2$ plasma during removal of a photoresist mask that is used to transfer a trench pattern into the damascene stack.

The integration of amorphous silicon carbide ($\alpha$-SiC:H) as a barrier/etch stop layer in a copper damascene fabrication scheme has been suggested as a possible solution to the problems of parasitic capacitance and RC delay in ultralarge scale integration. Although the $\alpha$-SiC:H film has a lower dielectric constant (k~4.5) than silicon nitride (k~7), $\alpha$-SiC:H has a higher current leakage level under high bias and a lower breakdown field than silicon nitride. Nitrogen doped SiC (SiCN) has been used as a barrier layer in a damascene structure as mentioned in U.S. Pat. No. 6,436,824. While SiCN can improve the leakage performance, trace amounts of amines in SiCN have a tendency to poison a photoresist layer in a via hole during patterning of a trench opening in a via first dual damascene scheme. As a result, photoresist residue remains in the via after exposed regions are developed in an aqueous base solution which leads to an expensive rework process. In addition, the dielectric constant of SiCN (k~4.9) is higher than the desired value of less than 4 and preferably less than 3 for a low k dielectric material. Therefore, an improved barrier layer or etch stop layer is required for new technologies which has a higher breakdown field and lower dielectric constant than current materials and which does not contain nitrogen that can have a deleterious effect on photoresist patterning.

One prior art method that mitigates the poisoning effect of a SiCN etch stop layer is described in U.S. Pat. No. 6,455,417 where a composite etch stop comprised of an upper carbon doped oxide (SiCOH) is formed over a lower SiCN layer on a substrate. The lower layer acts as a buffer to keep the oxide layer from oxidizing the underlying conductive metal while the SiCOH layer prevents the photoresist poisoning issue. However, this prior art does not address the issue of a relatively high k value for SiCN and a thick SiCOH layer may be necessary to prevent amines in SiCN from diffusing through the porous upper layer.

Other low k dielectric materials such as benzocyclobutene or hydrogen silsesquioxane (HSQ) are employed as an etch stop layer in a damascene structure in U.S. Pat. No. 6,417,090. However, there is no provision to form a buffer layer between the oxygen containing HSQ layer and an underlying copper pattern.

A carbon doped silicon oxide layer is formed on a substrate in U.S. Pat. No. 6,410,462 and uses silane, an oxygen source, and a mixture of $CH_4$ and acetylene for the deposition step. The introduction of methane and acetylene into the CVD process is claimed to promote a lower film density by forming more Si—O network terminating species. In this case, the composition of the SiCOH film appears to be less crosslinked than is normally desired and may result in a less mechanically sturdy structure. Low density also implies a higher porosity that can lead to water absorption and higher k value in subsequent processing steps.

An oxygen or nitrogen doped SiC layer is employed as an etch stop layer in U.S. Pat. No. 6,486,082. However, the concentration of the dopant is not described.

A method of incorporating a SiCOH layer with a low oxygen content, hereafter referred to as oxygen doped silicon carbide, as an etch stop or barrier layer in a dual damascene scheme is desirable so that a reduction in dielectric constant and a higher breakdown field can be achieved without compromising Cu barrier capability or a photoresist processing step. An oxygen doped silicon carbide etch stop layer should have good etch selectivity to other low k dielectric layers including SiCOH layers like Black Diamond™ from Applied Materials or CORAL™ available from Novellus.

SUMMARY OF THE INVENTION

An objective of the present invention is to provide a method of forming a dual damascene structure with a barrier/etch stop layer comprised of oxygen doped silicon carbide that has a dielectric constant of about 4 or less.

A further objective of the present invention is to provide an oxygen doped silicon carbide barrier/etch stop layer that has a better breakdown field than a silicon carbide layer.

A still further objective of the present invention is to integrate an oxygen doped silicon carbide barrier/etch stop layer into a damascene structure so that oxidation of an underlying metal layer is avoided.

Yet another objective of the present invention is to provide an oxygen doped silicon carbide layer that has good etch selectivity to other low k dielectric films including Black Diamond™ and CORAL™ and that has good copper barrier capability.

These objectives are achieved by providing a substrate having a first metal layer with an exposed top surface. The first metal layer may be formed in an opening that is lined with a diffusion barrier layer. In one embodiment, the first metal layer and diffusion barrier layer are contained in a first dielectric layer that has an overlying silicon carbide (SiC) cap layer which is coplanar with the first metal layer. A second SiC layer may be formed on the substrate to form a protective etch stop barrier over the first metal layer. Next, a first oxygen doped SiC layer is deposited on the SiC barrier layer by a plasma enhanced chemical vapor deposition (PECVD) process and also functions as a barrier/etch stop layer. The first oxygen doped SiC layer may be further processed by treating with a plasma comprised of an inert gas such as He, Ar, or $N_2$ to densify the layer and prevent any increase in dielectric constant. A second dielectric layer is deposited on the first oxygen doped SiC layer followed by formation of a second oxygen doped SiC layer on the second dielectric layer. The second oxygen doped SiC layer serves as a second etch stop layer and is deposited in a manner similar to the first oxygen doped SiC layer. The second oxygen doped SiC layer may also be densified with a plasma treatment. A third dielectric layer is deposited on the second oxygen doped SiC layer followed by formation of a cap layer on the third dielectric layer to complete the damascene stack.

A conventional process flow then follows and involves formation of a via pattern in the damascene stack by a photoresist patterning and etch sequence. Similar steps are taken to form a trench pattern in the cap layer and third dielectric layer that is aligned above the via pattern. The exposed first etch stop layer comprised of the second SiC layer and first oxygen doped SiC layer is removed to expose a portion of the surface of the first metal layer. A second diffusion barrier metal layer is deposited on the sidewalls and bottom of the trenches and via holes. Next, a second metal layer is deposited to fill the via and trench openings to a level above the cap layer. A planarization method such as a chemical mechanical polish (CMP) process is then employed to lower the second metal layer to a level that is coplanar with the cap layer on the damascene stack to complete the damascene sequence.

The invention is also a damascene structure that is formed on a substrate that may contain a first metal layer with an exposed top surface. The damascene structure has a first barrier/etch stop layer that is a composite of a lower SiC layer and a first oxygen doped SiC layer on the SiC layer. There is sequentially formed on the first oxygen doped SiC layer a second low k dielectric layer, a second oxygen doped etch stop layer, a third low k dielectric layer, and a cap layer on top of the damascene stack. The damascene stack has a trench in the cap layer and third dielectric layer which is aligned over a via that extends from the second etch stop layer through the second dielectric layer and first barrier/etch stop layer. There is a conformal diffusion barrier layer on the sidewalls and bottoms of the trench and via openings and a second metal layer formed on the diffusion barrier layer that is coplanar with the cap layer.

DETAILED DESCRIPTION OF THE INVENTION

The present invention is particularly useful in forming a dual damascene structure with high performance and good reliability. Although a via first dual damascene process is described, the method of incorporating an oxygen doped SiC etch stop layer into a damascene stack is equally effective for other damascene approaches including a single damascene method and a trench first dual damascene process. A first embodiment is depicted in FIGS. 1–5. The drawings are used for illustrative purposes and are not intended to limit the scope of the invention.

Figure 1:
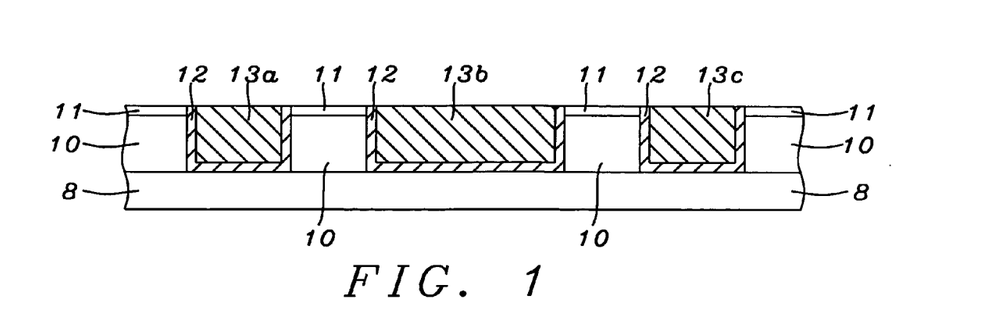
FIGS. 1–5 are cross-sectional views depicting a method of employing an oxygen doped SiC layer as a barrier and etch stop layer in a dual damascene process.

Referring to FIG. 1, a substrate 8 is provided that is typically monocrystalline silicon but optionally may be comprised of silicon-germanium, silicon-on-insulator, or other semiconductor materials used in the art. The substrate 8 may further include active and passive devices (not shown). In the exemplary embodiment, a first conductive layer comprised of three conductive lines is formed on the substrate 8. Alternatively, a first conductive layer may be formed with a different pattern. However, the conductive layer should have an exposed top surface.

A first dielectric layer 10 that is preferably comprised of a low k dielectric material selected from a group including fluorine doped $SiO_2$, carbon doped $SiO_2$, hydrogen silsesquioxane (HSQ), methyl silsesquioxane (MSQ), fluorinated polyimide, poly(arylether), or benzocyclobutene is deposited by a chemical vapor deposition (CVD), plasma enhanced CVD (PECVD), or a spin-on method. Two popular forms of carbon doped $SiO_2$ are Black Diamond™ from Applied Materials and COREL™ from Novellus. Additional processing of the first dielectric layer 10 may include a high temperature cure or anneal at temperatures of up to 600° C. A passivation layer 11 preferably comprised of silicon carbide is deposited by a CVD or PECVD technique and has a thickness between about 0 and 1000 Angstroms.

A conventional method is used to form openings in first dielectric layer 10 and is typically comprised of patterning a photoresist layer (not shown) on the passivation layer 11 and using the photoresist as a mask while transferring the pattern through the passivation layer 11 and first dielectric layer 10 by a plasma etch process. A conformal diffusion barrier layer 12 such as Ta, TaN, TaSiN, Ti, TiN, W, or WN having a thickness between 50 and 300 Angstroms is deposited on the sidewalls and bottom of openings in first dielectric layer 10. A first conductive layer that is preferably comprised of copper is deposited on the diffusion barrier layer 12 to form the conductive lines 13a, 13b, 13c. A planarization step is employed to lower the first conductive layer so that the conductive lines 13a–13c are coplanar with the passivation layer 11. For example, a chemical mechanical polish (CMP) process may be used. It is understood that the widths of the conductive lines 13a–13c are not necessarily equal in size. Similarly, the width of the first dielectric layer 10 between conductive lines 13a and 13b and between conductive lines 13b and 13c is not necessarily drawn to scale and could be larger or smaller in width than the width of the conductive lines 13a–13c.

Figure 2:
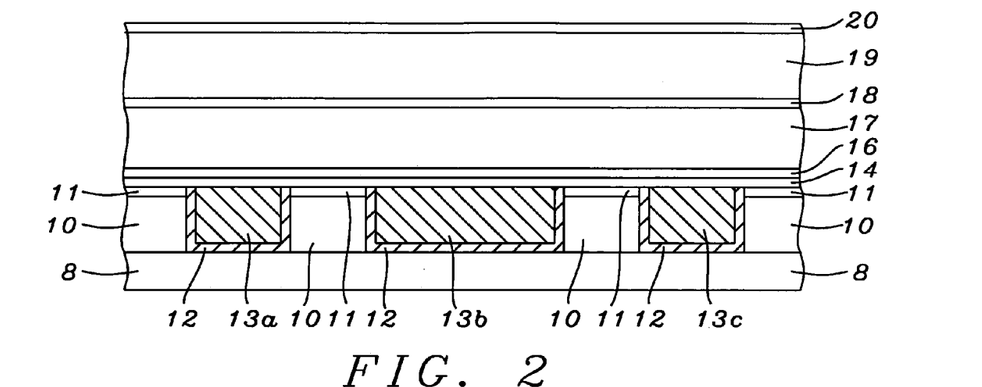

Referring to FIG. 2, a damascene stack of layers is fabricated by initially depositing a second SiC layer 14 having a thickness from about 50 to 150 Angstroms on the passivation layer 11 and on the conductive lines 13a–13c by a CVD or PECVD method. In the preferred embodiment where the passivation layer 11 is SiC, the second SiC layer 14 is not distinguishable from first SiC layer 11 and the combined SiC layers 11, 14 in FIGS. 3–5 will be referred to as SiC barrier layer 15.

Returning to FIG. 2, a first oxygen doped SiC etch stop layer 16 is preferably formed on the second SiC layer 14 by a PECVD process that includes $O_2$ with a flow rate from about 20 to 200 standard cubic centimeters per minute (sccm), a trimethylsilane or tetramethylsilane flow rate of 280 to 350 sccm, a helium flow rate of from 700 to 1000 sccm with a chamber pressure of from 2 to 8 torr, a RF power of from 100 to 1000 Watts and preferably 200 to 600 watts generated with a RF frequency of 13.56 MHz, and a substrate temperature between 300° C. and 400° C. and preferably 350° C. The helium is used to help transport the trimethylsilane or tetramethylsilane into the chamber. The process is preferably carried out using an inductively coupled plasma (ICP) source or a transformer coupled plasma (TCP) source to enable a higher degree of control and uniformity during the deposition. Under these conditions, the resulting oxygen doped SiC layer 16 typically has a lower oxygen content than Black Diamond™ or COREL™ films.

The thickness of the first oxygen doped SiC layer 16 is from 50 to 1000 Angstroms and preferably from 150 to 350 Angstroms. In one embodiment, the first oxygen doped SiC layer 16 is subjected to a plasma treatment known to those skilled in the art to stabilize the dielectric constant and prevent water uptake. For example, the first oxygen doped SiC layer 16 may be subjected to a plasma generated from $N_2$, He, or Ar to densify the layer. The plasma treatment is preferably performed in the same process chamber in which the previous PECVD process was carried out.

A second dielectric layer 17 having a thickness of from 2000 to 10000 Angstroms is deposited on the first oxygen doped SiC layer 16 by a CVD, PECVD or spin-on method. The second dielectric layer 17 is preferably comprised of a low k dielectric material and is selected from the same group of materials previously described for the first dielectric layer 10. A conventional cure or anneal process is typically performed to remove trace amounts of solvents and other low molecular weight compounds from the second dielectric layer 17. In one embodiment, the damascene stack is completed at this point.

In the exemplary embodiment, a second oxygen doped SiC layer 18 that functions as an etch stop is preferably formed on the second dielectric layer 17 by the same method employed to form first oxygen doped SiC layer 16 and has a thickness in the range of 50 to 1000 Angstroms. In one embodiment, the second oxygen doped SiC layer 18 is treated with a $N_2$, He, or Ar plasma to densify the layer and stabilize its dielectric constant during subsequent processes.

A third dielectric layer 19 having a thickness from 1000 to 10000 Angstroms is deposited on second oxygen doped SiC layer 18 by a CVD, PECVD, or spin-on method. The third dielectric layer 19 is preferably comprised of the same low k dielectric material used in the second dielectric layer 17 and is typically cured or annealed to drive off trace amounts of solvent and low molecular weight compounds. The damascene stack may be completed by deposition of a cap layer 20 with a thickness between 0 and 1000 Angstroms. The cap layer 20 is comprised of a material such as SiC, silicon nitride, silicon oxide, fluorine doped $SiO_2$, or silicon oxynitride which is deposited by a CVD or PECVD technique. The cap layer 20 is selected for its low removal rate in a subsequent CMP step and for its resistance to scratch and dishing defects during the polishing process.

Figure 3:
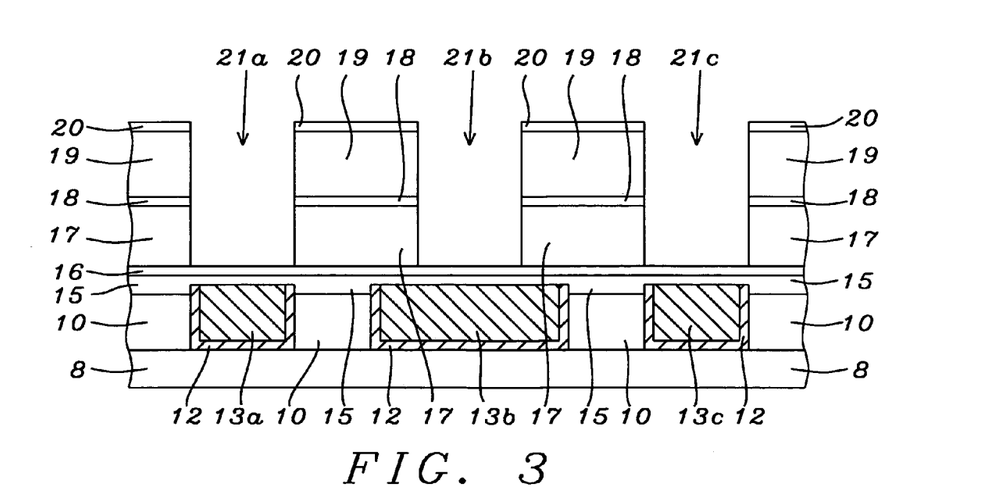

Referring to FIG. 3, a via pattern comprised of vias 21a–21c is formed in the damascene stack. Vias 21a, 21b, 21c are aligned above the conductive lines 13a, 13b, 13c, respectively, in the first conductive layer. The patterning method typically involves forming via openings in a photoresist layer (not shown) on the cap layer 20 or on the top layer of the damascene stack and employing the photoresist as a mask to transfer the pattern through the underlying layers by a plasma etch process that can have multiple steps. Note that the etch process stops on the first oxygen doped SiC layer 16 and the width of the vias 21a–21c should not be larger than the width of an underlying conductive line.

In a preferred embodiment, the first oxygen doped SiC layer 16 has enough selectivity to the second dielectric layer 17 so that a minimum amount of the first oxygen doped SiC layer 16 thickness is lost as the etch transfer step removes the last portion of the second dielectric layer 17 from the bottom of the vias 21a–21c. The etch process is usually not completely uniform and the second dielectric layer 17 may be removed from some vias faster than from others. For example, the etch rate of the second dielectric layer 17 in the vias 21a–21c that are in a dense array may be different than in an isolated via (not shown) in the same via pattern. The first oxygen doped SiC layer 16 is deposited in the preferred embodiment so that it has good selectivity towards carbon doped $SiO_2$ materials in the second dielectric layer 17 such as Black Diamond™ and COREL™ when a plasma etch generated from $C_4F_8$ and Ar gases is employed. Optionally, other fluorocarbons may be used in place of $C_4F_8$. Those skilled in the art will appreciate that the gas composition of the plasma etch through the second and third dielectric layers 17, 19 may be different than in the plasma etch through the cap layer 20 and through the second oxygen doped SiC layer 18.

In one embodiment, the first and second oxygen doped SiC layers 16, 18 are formed with a carbon content of from 17 to 25% and an oxygen content of from 5 to 15%. In comparison, Black Diamond™ or other SiCOH films generally have a carbon content of 10 to 15% and an oxygen content of 25 to 35%. As a result, an etch rate selectivity of between 6:1 and 10:1 is achieved for SiCOH relative to the oxygen doped SiC layers 16, 18 in an etch process having a plasma chemistry based on $C_4F_8$ and Ar.

Figure 4:
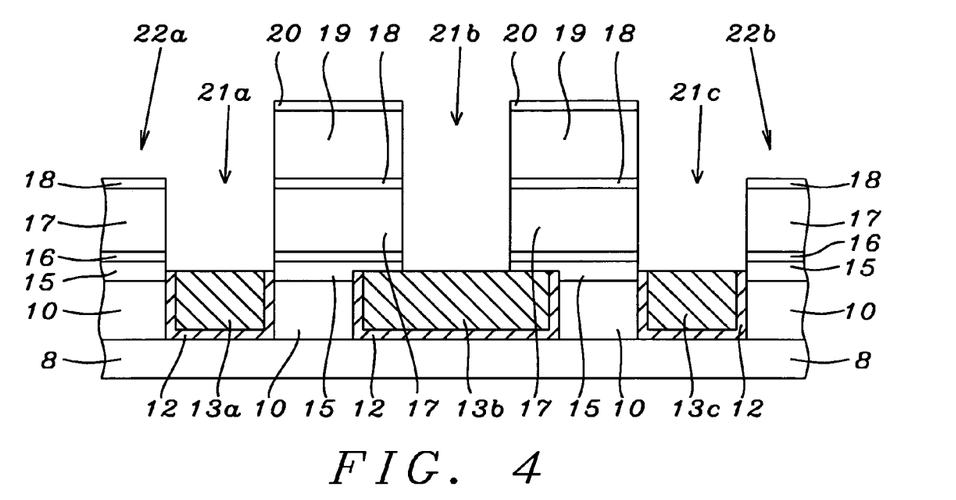

Referring to FIG. 4, a trench pattern that includes trenches 22a, 22b is formed in cap layer 20 and in the third dielectric layer 19. The trench 22a is aligned above the via 21a and may be formed above one or more other vias (not shown) while the trench 22b is aligned above via 21c and may be formed above one or more vias in an adjacent region of the pattern that is not pictured. This is only one possible embodiment for a dual damascene scheme and other designs in which a trench pattern is overlaid on a via hole pattern are equally useful in the present invention as appreciated by those skilled in the art. The trenches 22a, 22b are formed by a conventional sequence that normally involves patterning a photoresist layer (not shown) on the cap layer 20 and employing the photoresist as a mask while the trench openings are plasma etch transferred through the cap layer 20 and third dielectric layer 19. The photoresist remaining on the cap layer 20 and any organic material in vias 21a–21c including the first oxygen doped SiC layer 16 and second SiC layer 15 are then removed by a plasma etch so that conductive lines 13a–13c are exposed. Preferably, the SiC layer 15 is removed by a soft etch known to those skilled in the art that does not damage the underlying conductive lines 13a–13c and does not deform the sidewalls of the second and third dielectric layers 17, 19 or the sidewalls of the first and second oxygen doped SiC layers 16, 18.

Alternatively, when the second dielectric layer 17 is the top layer in the damascene stack, then a trench pattern is formed in the second dielectric layer and is aligned over the via pattern as appreciated by those skilled in the art.

Figure 5:
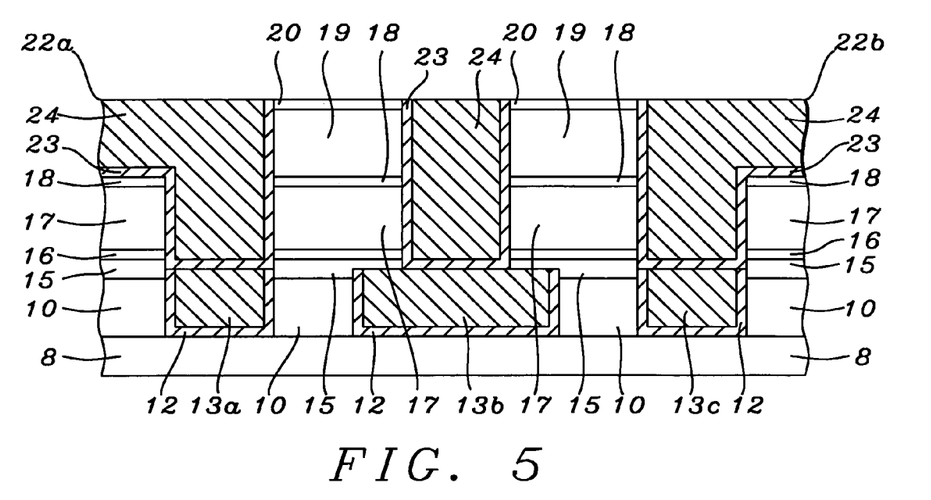

Referring to FIG. 5, a completed dual damascene structure is shown. Preferably, a second diffusion barrier layer 23 selected from the same group as described for first diffusion barrier layer 12 is deposited to a thickness of from 50 to 300 Angstroms on the sidewalls and bottoms of the trenches 22a, 22b and vias 21a–21c. Next, a metal layer 24 that is copper, Al, Al/Cu or W is deposited by an electroplating method or physical vapor deposition (PVD), for example, on the second diffusion barrier layer 23 to a level that is above the top of cap layer 20, or optionally, above the top layer in the damascene stack. The metal layer 24 is preferably planarized by a CMP process to a level that is coplanar with the cap layer 20 or the top of the damascene stack.

Figure 7:
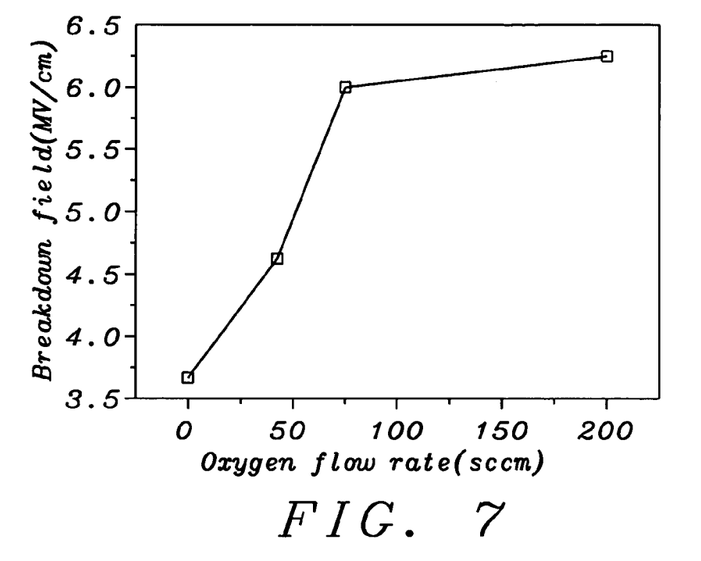
FIG. 7 is a plot showing breakdown field vs. oxygen flow rate for oxygen doped SiC layers that were deposited using different conditions by a method of the present invention.
Figure 8:
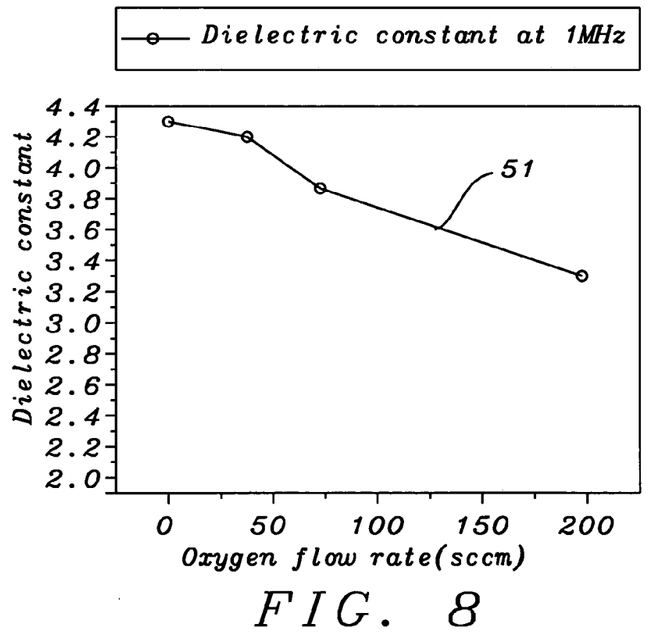
FIG. 8 is a plot showing dielectric constant as a function of oxygen flow rate for oxygen doped SiC layers that were deposited using different conditions according to a method of the present invention.

An advantage of the damascene method of the present invention is that the first and second oxygen doped SiC layers 16, 18 have a lower dielectric constant (k~3.7 to 4.3) than convention etch stops such as SiC (k~4.5) or SiCN (k~4.9). Furthermore, there is no nitrogen content in the oxygen doped SiC etch stop layers 16, 18 which eliminates any concern about contamination of photoresist in via holes during the trench definition step. Other performance advantages are realized because the oxygen doped SiC layer of the present invention has a higher breakdown field (6 mV/cm) than SiC (3.7 mV/cm) while exhibiting a similar Cu barrier capability to SiC and SiCN. The relationship between breakdown field and $O_2$ flow rate during the deposition of oxygen doped SiC layers 16, 18 is depicted in FIG. 7. Representative values for dielectric constants of the oxygen doped SiC layer 16, 18 formed at various $O_2$ flow rates are shown in FIG. 8.

The present invention is also a damascene structure comprised of one or more oxygen doped SiC etch stop layers as depicted in FIG. 5 and formed by a method of the first embodiment. Although a dual damascene structure is shown, other damascene schemes including a single damascene structure and a second dual damascene structure stacked on a first dual damascene structure are also compatible with the integration of oxygen doped SiC layers in a damascene stack in this invention. Moreover, the present invention anticipates a variety of damascene structures that include various combinations of a trench pattern overlaid on a via pattern. Additionally, the damascene stack may include only the first oxygen doped SiC and a second dielectric layer as the top layer.

A substrate 8 is provided that is preferably monocrystalline silicon but optionally may be based on silicon-germanium, silicon-on-insulator, or other semiconductor materials used in the art. There is a first dielectric layer 10 on the substrate 8 that is comprised of a low k dielectric material such as fluorine doped $SiO_2$, carbon doped $SiO_2$, hydrogen silsesquioxane (HSQ), methyl silsesquioxane (MSQ), fluorinated polyimide, poly(arylether), or benzocyclobutene having a thickness in the range of 1000 to 10000 Angstroms. Within the first dielectric layer 10 there is a first conductive layer comprised of the conductive lines 13a–13c. The first conductive layer is formed on a conformal diffusion barrier layer 12 that is Ta, TaN, TaSiN, Ti, TiN, W, or WN, for example, that lines the sidewalls and bottoms of the openings in the dielectric stack. The conductive lines 13a–13c are preferably comprised of copper and are coplanar with the top of the openings in the first dielectric layer 10.

The damascene structure includes a first barrier/etch stop layer that is a composite of a lower SiC layer 15 with a thickness between 50 and 150 Angstroms and an upper oxygen doped SiC layer 16 having a thickness from 50 to 1000 Angstroms. The oxygen doped SiC layer 16 has the following composition: 25 to 35 atomic % Si; 17 to 25 atomic % C; 5 to 15 atomic % 0; and 20 to 40 atomic % H. In one embodiment, the bottom of the SiC layer 15 is at a level on the first dielectric layer 10 that is below the top of the conductive lines 13a–13c. Alternatively, the SiC layer 15 is formed on a first dielectric layer 10 that is coplanar with the conductive lines 13a–13c. A succession of layers is formed on the first oxygen doped SiC layer 16 and includes in order a second dielectric layer 17, a second oxygen doped SiC etch stop layer 18 with a thickness and composition similar to first oxygen doped SiC layer 16, a third dielectric layer 19, and a cap layer 20 on top of the damascene stack. Second and third dielectric layers 17, 19 are selected from the same group of materials as described for the first dielectric layer 10 and have a thickness in a range of 2000 to 10000 Angstroms. The cap layer 20 is from 0 to 1000 Angstroms thick and is SiC, silicon nitride, silicon oxide, fluorine doped $SiO_2$, or silicon oxynitride.

In the exemplary embodiment, the damascene stack has trenches 22a, 22b in the cap layer 20 and third dielectric layer 19 that are aligned over the vias 21a and 21c, respectively, which extend through the first and second oxygen doped SiC layers 16, 18, the second dielectric layer 17, and through SiC layer 15. The via 21a is aligned over the conductive line 13a while the via 21c is aligned over the conductive line 13c. A third via 21b extends through the cap layer 20, second and third dielectric layers 17, 19, and through SiC layer 15 and first and second oxygen doped SiC layers 16, 18 above conductive line 13b. Other trenches and vias may be present in the damascene stack above substrate 8 but are not shown. For example, the trench 22a may be formed over other vias besides via 21a and the trench 22b may be formed over other vias in addition to via 21c. Moreover, other designs in which a trench pattern is overlaid on a via pattern is anticipated as described previously.

There is a second diffusion barrier layer 23 with a thickness of 50 to 300 Angstroms formed on the sidewalls and bottoms of the trenches 22a, 22b and vias 21a–21c that is selected from the same group of materials as mentioned earlier for the first diffusion barrier layer 12. A metal layer 24 is formed that fills the trenches 22a, 22b and vias 21a–21c and is coplanar with the cap layer 20 and with the top of second diffusion barrier layer 23. The metal layer 24 is preferably comprised of copper but optionally may be Al/Cu, Al, or W Although the invention is not limited to a specific size of width for the first conductive layer and metal layers, the invention is especially effective in improving the performance of a device where the width of the first conductive layer and metal layer is less than about 0.25 microns.

An advantage of the damascene structure of the present invention is that the first and second oxygen doped SiC layers 16, 18 have a lower dielectric constant (k~3.7 to 4.3) than conventional etch stops including SiC (k~4.5) or SiCN (k~4.9). Other performance advantages are realized because the oxygen doped SiC layer of the present invention has a higher breakdown field (6 mV/cm) than SiC (3.7 mV/cm) while exhibiting a similar Cu barrier capability to SiC and SiCN. The relationship between breakdown field and $O_2$ flow rate during the deposition of oxygen doped SiC layers 16, 18 is depicted in FIG. 7. Representative values for dielectric constants of the oxygen doped SiC layer 16, 18 formed at various $O_2$ flow rates are shown in FIG. 8.

An example in which an oxygen doped SiC layer is deposited on a substrate according to the present invention is provided in Example 1.

EXAMPLE 1

A 1 micron thick copper film was deposited on 200 mm silicon wafers by an ECP method. Next, a series of oxygen doped SiC films with a thickness of 500 Angstroms were deposited on the copper coated wafers in a Producer tool available from Applied Materials (AMAT) by a PECVD process involving an oxygen flow rate of from 0 to 200 sccm, a helium flow rate of 800 sccm, a trimethylsilane flow rate of 320 sccm at a substrate temperature of 350° C. with a RF power of 460 Watts generated with a RF frequency of 13.56 MHz and with a chamber pressure of 3.5 Torr. The deposition rate is about 900 Angstroms per minute. The films were annealed by baking at 400° C. for four hours in a nitrogen ambient.

Figure 6:
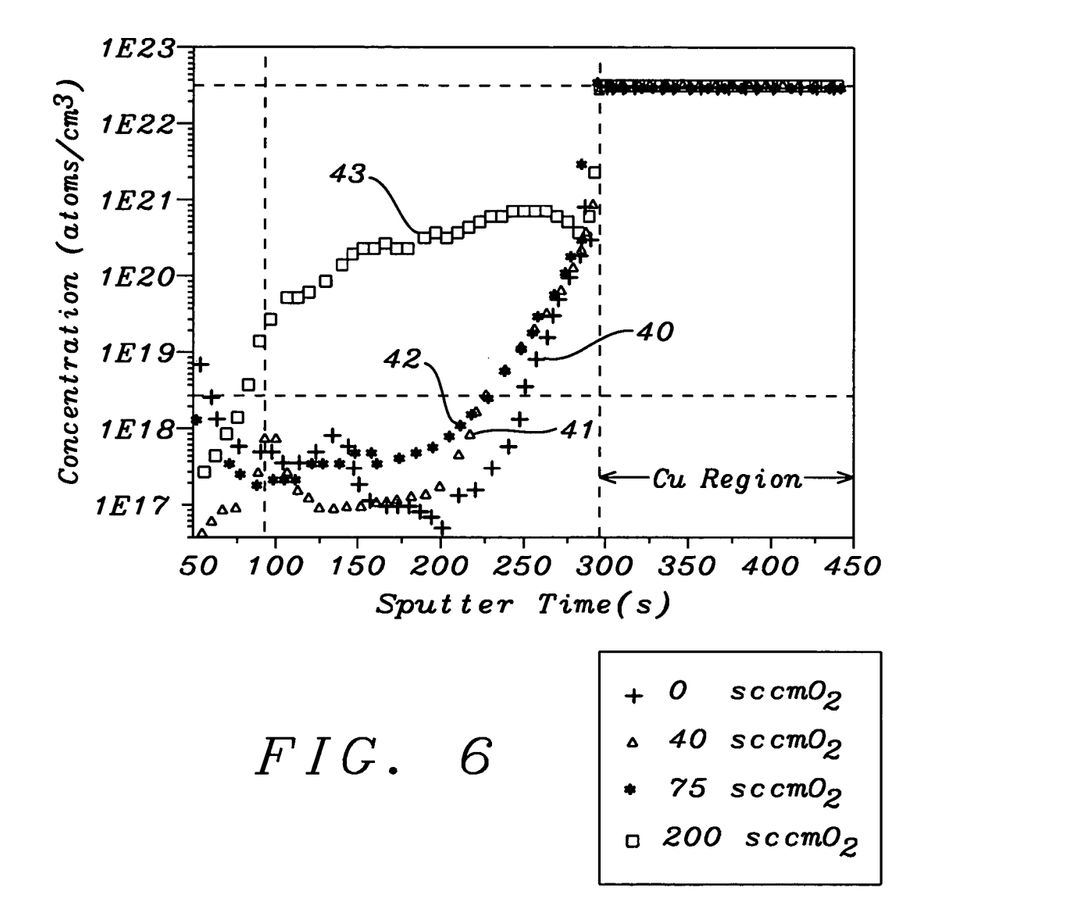
FIG. 6 is a plot showing density vs. sputter time during an ESCA analysis of an oxygen doped SiC layer that was deposited by a method of the present invention.

As shown in FIG. 6, a SIMS analysis of the resulting films was plotted as copper concentration or density in terms of atoms/cm$^3$ vs. sputter time during the analysis. Curve 40 represents a SiC film deposited with no oxygen flow rate. Curve 41 represents an oxygen doped SiC film deposited with a 40 sccm flow rate of $O_2$ while curves 42 and 43 show the results from oxygen doped SiC films deposited with $O_2$ flow rates of 75 scorn and 200 sccm, respectively. The films deposited at the three lower $O_2$ flow rates (curves 40, 41, 42) tend to have a fairly low copper out-diffusion into the oxygen doped films. However, the oxygen doped SiC layer formed with a 200 sccm $O_2$ flow rate exhibits a much lower resistance to block the copper out-diffusion. The inventors have determined that an oxygen flow rate of 20 to 75 sccm is preferred at these conditions because the resulting films have a high enough resistance to block the copper out-diffusion.

The breakdown field (Mv/cm) of the oxygen doped SiC films as a function of $O_2$ flow rate during deposition was determined by an Al dot I-V measurement at 150° C. which is well known to those skilled in the art. FIG. 7 shows that the breakdown field improves rapidly while increasing the $O_2$ flow rate to 75 sccm and then has a further slight improvement at a 200 sccm $O_2$ flow rate. At $O_2$ flow rates between 20 and 75 sccm, the oxygen doped SiC films have a breakdown field of greater than 4 mV/cm which is better than a pure SiC film.

Referring to FIG. 8, the dielectric constants of the various films were measured at 1 MHz (Curve 51) by an Al dot I-V test at room temperature which indicates that the dielectric constant becomes lower as the oxygen flow rate increases and changes from about 4.3 at 0 sccm $O_2$ to 3.7 for a 75 sccm $O_2$ flow rate.

The results obtained from the three different types of analyses demonstrate that an oxygen doped SiC film deposited at $O_2$ flow rates between about 20 and 75 sccm has an advantage over a conventional SiC layer (0 $O_2$ flow rate) in terms of a lower dielectric constant and a higher breakdown field. Furthermore, the oxygen doped SiC film of the present invention has an equivalent capacity to function as a copper out-diffusion barrier.

While this invention has been particularly shown and described with reference to, the preferred embodiments thereof, it will be understood by those skilled in the art that various changes in form and details may be made without departing from the spirit and scope of this invention.

We claim:

1. A damascene method, comprising:
   (a) providing a substrate;
   (b) depositing a composite barrier/etch stop layer comprised of a lower silicon carbide (SiC) layer and an upper oxygen doped SiC layer on said substrate;
   (c) forming a first dielectric layer on said upper oxygen doped SiC layer;
   (d) forming an opening with sidewalls and a bottom in said first dielectric layer;
   (e) removing said composite barrier/etch stop layer that is exposed at the bottom of said opening;
   (f) depositing a conformal diffusion barrier layer on the sidewalls and bottom of said opening; and
   (g) depositing a metal layer on the conformal diffusion barrier layer that fills said opening.

2. The method of claim 1 wherein the substrate is comprised of a conductive layer with a top surface and said opening exposes a portion of the top surface of the conductive layer.

3. The method of claim 2 wherein the conductive layer and the metal layer are comprised of copper.

4. The method of claim 1 wherein the diffusion barrier layer is comprised of Ta, TaN, TaSiN, Ti, TiN, W, or WN and has a thickness in the range of about 50 to 300 Angstroms.

5. The method of claim 1 wherein said first dielectric layer is comprised of Black Diamond™, CORAL™, fluorine doped $SiO_2$, hydrogen silsesquioxane (HSQ), methyl silsesquioxane (MSQ), a fluorinated polyimide, a polyarylether, or benzocyclobutene.

6. The method of claim 1 wherein the lower SiC layer has a thickness from about 50 to 150 Angstroms and the upper oxygen doped SiC layer has a thickness between about 50 and 1000 Angstroms.

7. The method of claim 1 wherein the upper oxygen doped SiC layer is deposited by a PECVD process that includes an oxygen flow rate from about 20 to 200 standard cubic centimeters per minute (sccm), a helium flow rate of about 700 to 1000 sccm, a trimethylsilane or tetramethylsilane flow rate of about 280 to 350 sccm, a substrate temperature of from 300° C. to 400° C., a chamber pressure of 2 to 8 Torr, and a RF power of about 100 to 1000 Watts that is generated with a RE frequency of 13.56 MHz.

8. The method of claim 7 wherein the substrate temperature is 350° C., the RF power is 460 Watts, chamber pressure is 3.5 Torr, the $O_2$ flow rate is about 30 sccm, the He flow rate is about 800 sccm, and the trimethylsilane flow rate is about 320 sccm to give an oxygen doped SiC deposition rate in the range of 850 to 950 Angstroms per minute.

9. The method of claim 7 wherein the upper oxygen doped SiC layer has a silicon content from about 25 to 35 atomic weight %, a carbon content of about 17 to 25 atomic wt. %, an oxygen content of about 5 to 15 atomic wt. %, and a hydrogen content from about 20 to 40 atomic wt. %.

10. The method of claim 7 wherein the upper oxygen doped SiC layer has a good etch selectivity to Black Diamond™ or CORAL™ of about 1:6 to 1:10 in a plasma etch comprised of $C_4F_8$ and Ar gases.

11. The method of claim 1 further comprised of treating said upper oxygen doped SiC layer with a $N_2$, He, or Ar plasma before said first dielectric layer is formed.

12. The method of claim 1 further comprised of a chemical mechanical polish process to planarize said metal layer.

13. A dual damascene method, comprising:
(a) providing a substrate with a conductive layer formed within a first dielectric layer, said conductive layer has an exposed top surface that is coplanar with the top surface of said substrate;
(b) depositing a barrier/etch stop layer comprised of a lower silicon carbide (SiC) layer and an upper first oxygen doped SiC layer on said substrate
(c) forming a second dielectric layer on said upper first oxygen doped SiC layer;
(d) depositing a second oxygen doped SiC etch stop layer on said second dielectric layer;
(e) forming a third dielectric layer on said second oxygen doped SiC layer;
(f) forming an opening comprised of a via that exposes said conductive layer and a trench aligned above said via wherein the via has sidewalls and a bottom and extends through said second and third dielectric layers, second oxygen doped SiC layer, and through the composite barrier/etch stop layer and wherein the trench has sidewalls and a bottom and is formed in the third dielectric layer; and
(g) depositing a conformal diffusion barrier layer on the sidewalls and bottom of said trench and via and depositing a metal layer on said conformal diffusion barrier layer that fills said trench and via.

14. The method of claim 13 further comprised of forming a cap layer on the third dielectric layer and wherein the trench is aligned above a via that exposes the conductive layer and said trench is formed in the cap layer and third dielectric layer.

15. The method of claim 13 wherein said conductive layer and metal layer are comprised of copper.

16. The method of claim 13 wherein the diffusion barrier layer is comprised of Ta, TaN, TaSiN, Ti, TIN, W, or WN and has a thickness in the range of about 50 to 300 Angstroms.

17. The method of claim 13 wherein said first, second, and third dielectric layers are a low k dielectric material comprised of Black Diamond™, CORAL™, fluorine doped $SiO_2$, hydrogen silsesquioxane (HSQ), methyl silsesquioxane (MSQ), a fluorinated polyimide, a polyarylether, or benzocyclobutene.

18. The method of claim 13 wherein said second and third dielectric layers have a thickness in the range of about 1000 to 10000 Angstroms.

19. The method of claim 14 wherein the lower silicon carbide (SiC) layer has a thickness from about 50 to 150 Angstroms and the upper first oxygen doped SiC layer and second oxygen doped SiC layers have a thickness between about 50 and 1000 Angstroms.

20. The method of claim 13 wherein said upper first oxygen doped SiC layer and second oxygen doped SiC layers are deposited by a PECVD process that includes an oxygen flow rate from about 20 to 200 sccm, a helium flow rate of about 700 to 1000 sccm, a trimethylsilane or tetramethylsilane flow rate of about 280 to 350 sccm, a substrate temperature of from 300° C. to 400° C., a chamber pressure of 2 to 8 Torr, and a RF power of about 100 to 1000 Watts that is generated with a RF frequency of 13.56 MHz.

21. The method of claim 20 wherein the substrate temperature is 350° C., the RF power is 460 Watts, chamber pressure is 3.5 torr, the $O_2$ flow rate is 30 sccm, the He flow rate is 800 sccm, and the trimethylsilane flow rate is 320 sccm to give an oxygen doped SiC deposition rate in the range of 850 to 950 Angstroms per minute.

22. The method of claim 20 wherein the upper first oxygen doped SiC layer and second oxygen doped SiC layers have an etch selectivity to Black Diamond™ or CORAL™ of about 1:6 to 1:10 in a plasma etch comprised of $C_4F_8$ and Ar gases.

23. The method of claim 21 wherein the composition of the upper first oxygen doped SiC layer and second oxygen doped SiC layers has a silicon content from about 25 to 35 atomic weight %, a carbon content of about 17 to 25 atomic wt. %, an oxygen content of about 5 to 15 atomic wt. %, and a hydrogen content from about 20 to 40 atomic wt. %.

24. The method of claim 13 further comprised of treating the upper first oxygen doped SiC layer with a $N_2$, Ar, or He plasma prior to depositing the second dielectric layer and treating the second oxygen doped SiC layer with a $N_2$, Ar, or He plasma prior to depositing the third dielectric layer.

* * * * *